US011501993B2

(12) United States Patent
Li et al.

(10) Patent No.: US 11,501,993 B2
(45) Date of Patent: Nov. 15, 2022

(54) SEMICONDUCTOR SUBSTRATE SUPPORTS WITH IMPROVED HIGH TEMPERATURE CHUCKING

(71) Applicant: Applied Materials, Inc., Santa Clara, CA (US)

(72) Inventors: Jian Li, Fremont, CA (US); Juan Carlos Rocha-Alvarez, San Carlos, CA (US); Zheng John Ye, Santa Clara, CA (US); Daemian Raj Benjamin Raj, Fremont, CA (US); Shailendra Srivastava, Fremont, CA (US); Xinhai Han, Santa Clara, CA (US); Deenesh Padhi, Sunnyvale, CA (US); Kesong Hu, Pleasanton, CA (US); Chuan Ying Wang, Sunnyvale, CA (US)

(73) Assignee: Applied Materials, Inc., Mountain View, CA (US)

( * ) Notice: Subject to any disclaimer, the term of this patent is extended or adjusted under 35 U.S.C. 154(b) by 8 days.

(21) Appl. No.: 16/936,042

(22) Filed: Jul. 22, 2020

(65) Prior Publication Data
US 2021/0035843 A1 Feb. 4, 2021

Related U.S. Application Data

(60) Provisional application No. 62/879,696, filed on Jul. 29, 2019.

(51) Int. Cl.
*H01L 21/683* (2006.01)
*H01L 21/50* (2006.01)
(Continued)

(52) U.S. Cl.
CPC .......... *H01L 21/6833* (2013.01); *H01L 21/50* (2013.01); *H02N 13/00* (2013.01);
(Continued)

(58) Field of Classification Search
CPC ............... H02N 13/00; H01L 21/6833; H01L 21/67103; H01L 21/0217; H01L 21/02164;
(Continued)

(56) References Cited

U.S. PATENT DOCUMENTS

| 6,204,489 B1 * | 3/2001 | Katsuda ................. H05B 3/748 219/544 |
| 2003/0033116 A1 * | 2/2003 | Brcka .................. H01L 21/6831 702/182 |

(Continued)

FOREIGN PATENT DOCUMENTS

| JP | 2007-173596 A | 7/2007 |
| JP | 6424954 B2 | 11/2018 |

(Continued)

OTHER PUBLICATIONS

International Search Report and Written Opinion dated Nov. 6, 2020 in International Patent Application No. PCT/US2020/043048, 12 pages.

(Continued)

*Primary Examiner* — Danny Nguyen
(74) *Attorney, Agent, or Firm* — Kilpatrick Townsend & Stockton LLP

(57) ABSTRACT

Exemplary support assemblies may include an electrostatic chuck body defining a substrate support surface. The assemblies may include a support stem coupled with the electrostatic chuck body. The assemblies may include a heater embedded within the electrostatic chuck body. The assemblies may also include an electrode embedded within the electrostatic chuck body between the heater and the substrate support surface. The substrate support assemblies may be characterized by a leakage current through the electrostatic chuck body of less than or about 4 mA at a temperature (Continued)

of greater than or about 500° C. and a voltage of greater than or about 600 V.

20 Claims, 4 Drawing Sheets

(51) Int. Cl.
    *H02N 13/00*     (2006.01)
    *H01L 21/60*     (2006.01)

(52) U.S. Cl.
    CPC ...... *H01L 21/6831* (2013.01); *H01L 21/6836* (2013.01); *H01L 2021/6015* (2013.01)

(58) Field of Classification Search
    CPC ............. H01L 21/6831; H01L 21/6836; C23C 16/4586; C23C 16/45544; C23C 16/45536; G06F 11/30
    USPC ........................................................ 361/234
    See application file for complete search history.

(56) References Cited

U.S. PATENT DOCUMENTS

| | | | |
|---|---|---|---|
| 2015/0228528 A1* | 8/2015 | Behdjat | H01L 21/6875 219/392 |
| 2016/0064264 A1* | 3/2016 | Kulshreshtha | H01L 21/6833 438/787 |
| 2017/0184976 A1* | 6/2017 | Ouyang | G03F 7/38 |
| 2017/0352569 A1 | 12/2017 | Khaja et al. | |
| 2020/0165723 A1* | 5/2020 | Fujisato | C23C 16/45542 |

FOREIGN PATENT DOCUMENTS

| | | |
|---|---|---|
| KR | 2009-0079540 A | 7/2009 |
| WO | 2018-020956 A1 | 2/2018 |

OTHER PUBLICATIONS

International Preliminary Report on Patentability dated Feb. 10, 2022 in International Patent Application No. PCT/US2020/043048, 8 pages.

* cited by examiner

SEMICONDUCTOR SUBSTRATE SUPPORTS WITH IMPROVED HIGH TEMPERATURE CHUCKING

CROSS-REFERENCE TO RELATED APPLICATIONS

The present application claims the benefit of, and priority to U.S. Provisional Patent Application No. 62/879,696, filed Jul. 29, 2019, the contents of which are hereby incorporated by reference in their entirety for all purposes.

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma. Plasma generated near the substrate may cause bombardment of components, as well as parasitic plasma formation in unfavorable regions of the chamber. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary support assemblies may include an electrostatic chuck body defining a substrate support surface. The assemblies may include a support stem coupled with the electrostatic chuck body. The assemblies may include a heater embedded within the electrostatic chuck body. The assemblies may also include an electrode embedded within the electrostatic chuck body between the heater and the substrate support surface. The substrate support assemblies may be characterized by a leakage current through the electrostatic chuck body of less than or about 4 mA at a temperature of greater than or about 500° C. and a voltage of greater than or about 600 V.

In some embodiments, the substrate support surface may define a recessed ledge extending radially inward from an outer radial edge of the recessed pocket. The electrostatic chuck body may define a plurality of protrusions extending from the substrate support surface within the recessed pocket. A distance between a radially outermost protrusion and in inner radial edge of the recessed ledge may be maintained below or about 3 mm. The electrostatic chuck body may define greater than or about 500 protrusions, and each protrusion of the plurality of protrusions may be characterized by a diameter of greater than or about 1 mm. A subset of protrusions of the plurality of protrusions may be characterized by a diameter of greater than or about 2 mm. The plurality of protrusions may define a contact area for a substrate seated on the substrate support surface of the electrostatic chuck body, and the contact area may be less than or about 10% of a planar area of the substrate. The electrostatic chuck body may include a ceramic material. The ceramic material may be or include aluminum nitride. The ceramic material may be characterized by a volumetric resistivity of greater than or about 1×109 ohm-cm at a temperature of greater than or about 550° C.

Some embodiments of the present technology may encompass substrate support assemblies. The substrate support assemblies may include an electrostatic chuck body defining a substrate support surface. The assemblies may include a heater embedded within the electrostatic chuck body. The assemblies may include an electrode embedded within the electrostatic chuck body between the heater and the substrate support surface. The electrode may be maintained a distance of at least about 3 mm from the substrate support surface within the electrostatic chuck body. The substrate support assembly may be characterized by a leakage current through the electrostatic chuck body of less than or about 4 mA at a temperature of greater than or about 540° C. and a voltage of greater than or about 660 V.

In some embodiments the electrode may be positioned within the electrostatic chuck body at a depth of at least about 5 mm from the substrate support surface of the electrostatic chuck body. The electrostatic chuck body may include a ceramic material characterized by a volumetric resistivity of greater than or about 1×109 ohm-cm at a temperature of greater than or about 600° C. The electrostatic chuck body may define a recessed pocket within the substrate support surface configured to receive a substrate for processing. The substrate support surface may define a recessed ledge extending radially inward from an outer radial edge of the recessed pocket. The electrostatic chuck body may define a plurality of protrusions extending from the substrate support surface within the recessed pocket. The plurality of protrusions may define a contact area for a substrate seated on the substrate support surface of the electrostatic chuck body. The contact area may be less than or about 5% of a planar area of the substrate. The substrate support assembly may be characterized by a leakage current through the electrostatic chuck body of less than or about 4 mA at a temperature of greater than or about 600° C. and a voltage of greater than or about 800 V.

Some embodiments of the present technology may encompass substrate support assemblies. The assemblies may include an electrostatic chuck body defining a substrate support surface. The assemblies may include a support stem coupled with the electrostatic chuck body. The assemblies may include a heater embedded within the electrostatic chuck body. The assemblies may include an electrode embedded within the electrostatic chuck body between the heater and the substrate support surface. The electrode may be maintained a distance of at least about 5 mm from the substrate support surface within the electrostatic chuck body. The substrate support assembly may be characterized by a leakage current through the electrostatic chuck body of less than or about 4 mA at a temperature of greater than or about 550° C. and a voltage of greater than or about 650 V.

Such technology may provide numerous benefits over conventional systems and techniques. For example, embodiments of the present technology may provide substrate supports that may both facilitate substrate-level plasmas, and may remain sustainable during high-temperature operations. Additionally, by providing reduced leakage currents relative to conventional technologies, an increased voltage chucking window may be afforded. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
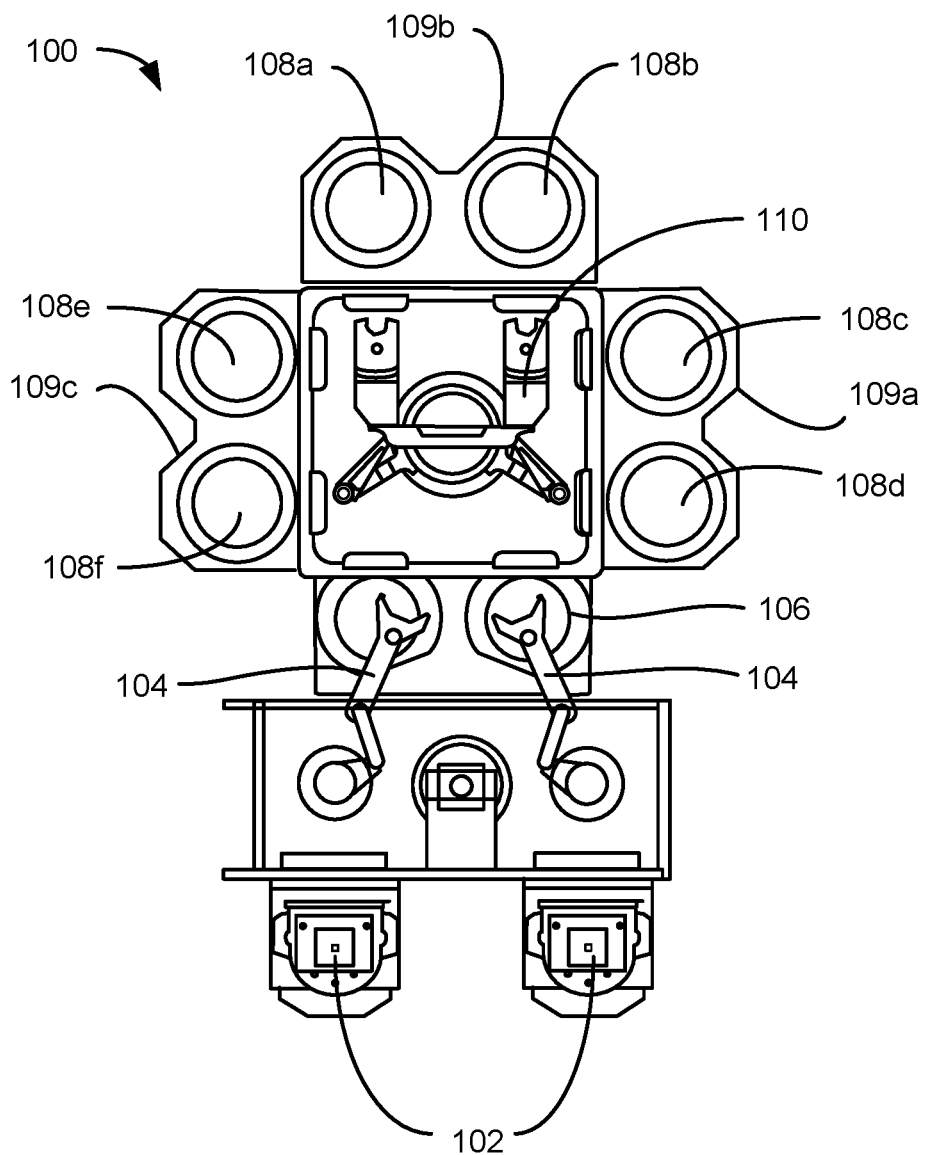
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. These formed films may be produced under conditions that cause stresses on the substrate. For example, in the development of dielectric layers for vertical memory applications, such as ON stacks, many layers of material may be deposited on a substrate. These produced films may be characterized by internal stresses that act upon the substrate. This may cause a substrate to bow during processing, which can lead to poor uniformity of formation, as well as device damage or malfunction.

An electrostatic chuck may be used to produce a clamping action against the substrate to overcome the bowing stress. However, as these device stacks increase in numbers of layers, the stresses acted upon the substrate increase, which may require a proportional increase in chucking voltage. Additionally, many of these films may be developed at relatively high temperatures that further affect components of the chamber. For example, some deposition activities may occur at temperatures above 500° C. or higher, which may affect the resistivity of chamber components, such as the materials of the electrostatic chuck. As the resistivity of the material reduces, current leakage may increase. When compounded with the increased voltages used to overcome the bowing stresses exerted on the substrate with increased deposition layers, electric arcs may be produced, which can damage substrates and chamber components. These issues have limited conventional technologies to narrow chucking windows that cannot accommodate increased scaling of layers during deposition.

The present technology overcomes these challenges with substrate support assemblies having particular materials and configurations exhibiting specific electrical characteristics that may produce reduced leakage currents over conventional technologies, especially at increased temperatures. Additionally, the assemblies may include surface topographies that facilitate clamping of substrates having stresses corresponding to increased layers of deposition.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
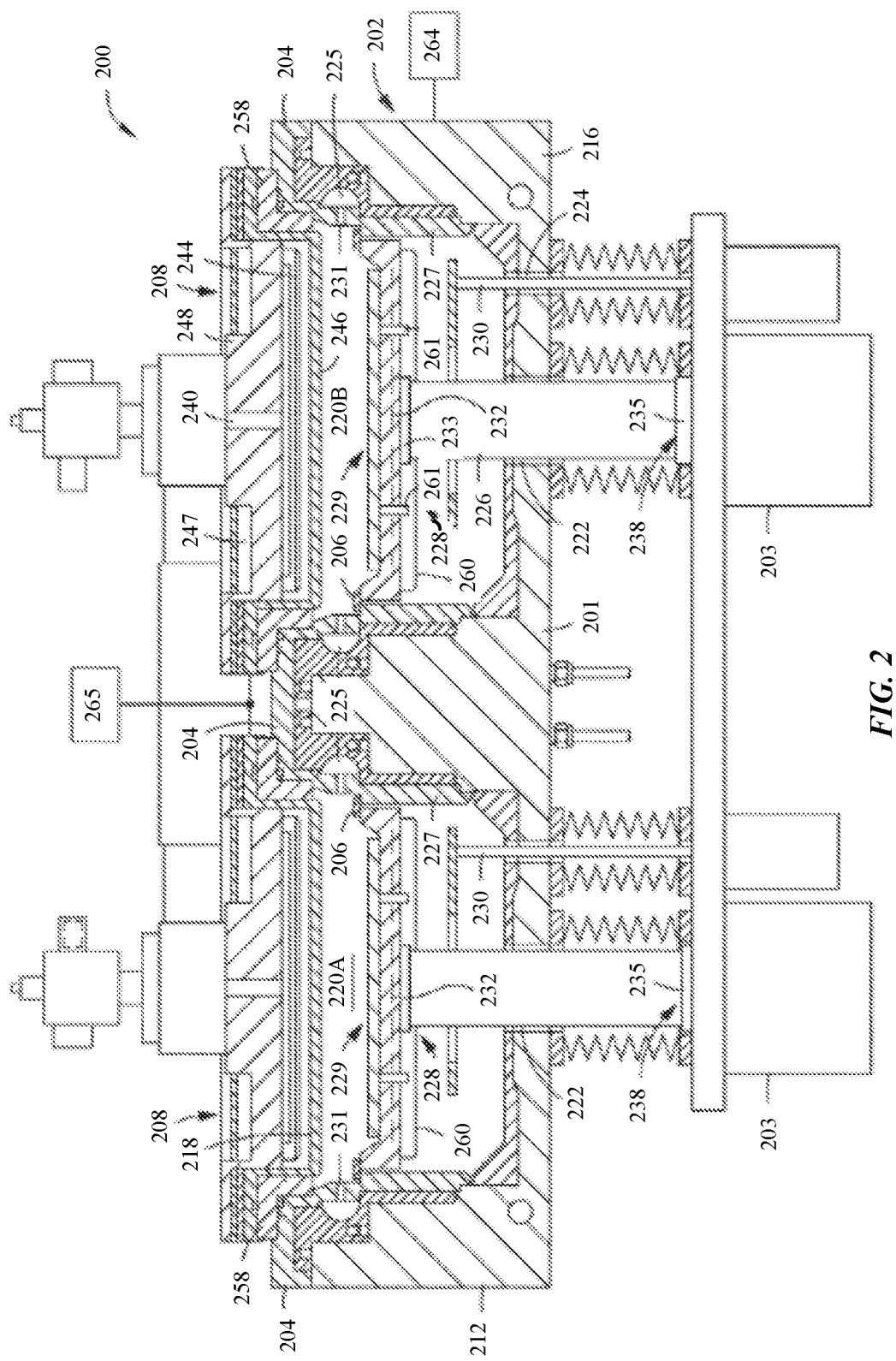
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
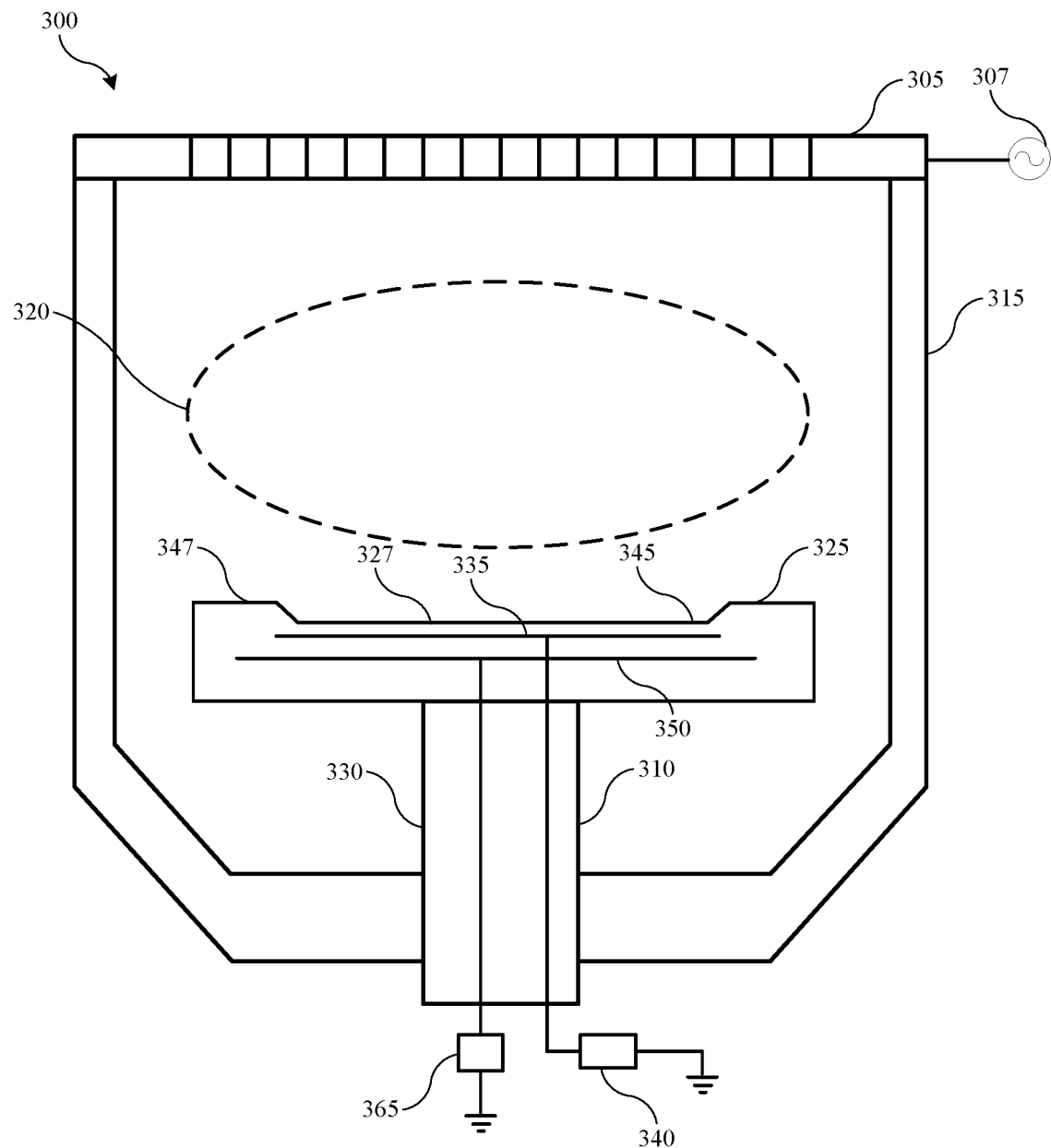
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels as will be discussed below for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include an electrode 335, which may be a DC electrode, embedded within the chuck body proximate the substrate support surface. Electrode 335 may be electrically coupled with a power source 340. Power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, electrode 335 may also be a chucking mesh that operates as electrical ground for a capacitive plasma system including an RF source 307 electrically coupled with showerhead 305. For example, electrode 335 may operate as a ground path for RF power from the RF source 307, while also operating as an electric bias to the substrate to provide electrostatic clamping of the substrate to the substrate support surface. Power source 340 may include a filter, a power supply, and a number of other electrical components configured to provide a chucking voltage.

In operation, a substrate may be in at least partial contact with the substrate support surface of the electrostatic chuck body, which may produce a contact gap, which may essentially produce a capacitive effect between a surface of the pedestal and the substrate. Voltage may be applied to the contact gap, which may generate an electrostatic force for chucking. The power supply 340 may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrode 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, as will be described further below, the chuck heater may be operated to maintain a substrate temperature above at least 500° C. during deposition operations, such as forming stacks of material for memory devices as previously described.

Figure 4:
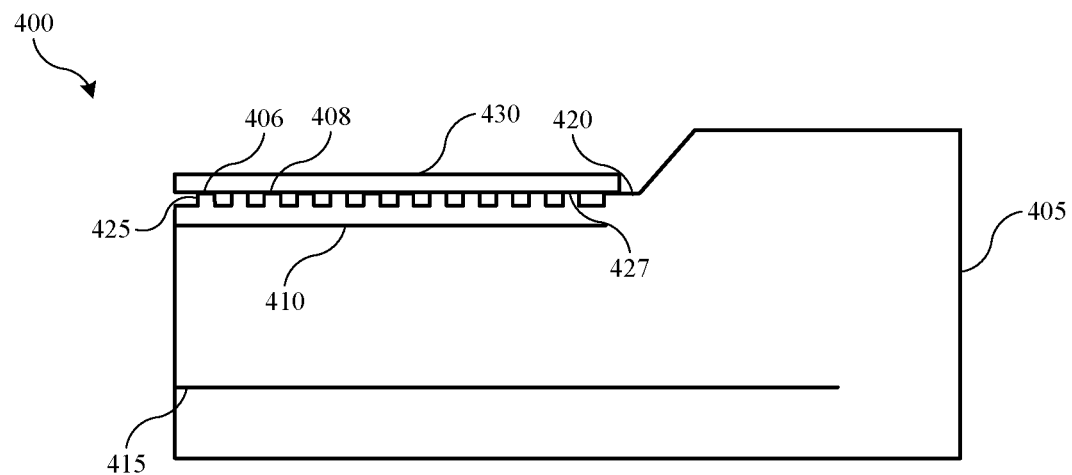
FIG. 4 shows a schematic partial cross-sectional view of an exemplary substrate support assembly according to some embodiments of the present technology.

FIG. 4 shows a schematic partial cross-sectional view of an exemplary substrate support assembly 400 according to some embodiments of the present technology. Substrate support assembly 400 may include any of the materials or components previously described, and may illustrate additional details of substrate support assemblies previously discussed. As illustrated, an electrostatic chuck body 405 may include an embedded electrode 410 and an embedded heater 415 as previously described. A substrate support surface 406 may be defined by the chuck body and may be configured to support a semiconductor substrate 430. The substrate support surface may define a recessed pocket 408 within the substrate support surface. A recessed ledge 420 may be defined in the substrate support surface as well. The recessed ledge may extend radially inward from an outer radial edge of the recessed pocket. Additionally, the substrate support surface may define a number of protrusions 425 extending from the substrate support surface within the recessed pocket 408. An exposed surface across the protrusions 425 may define contact locations where substrate 430 may contact the substrate support surface.

As described above, a power supply may be provided for each of the heater 415 and the electrode 410 in embodiments, which may be any number of power supplies. For example, the power supply for the electrode may be a DC power supply, or any other power supply, and may provide a voltage range configured to chuck a substrate to the substrate support surface 406. For example, a relatively higher power supply may be used for systems according to some embodiments of the present technology to facilitate chucking substrates having thicker deposition layers, which may be characterized by greater stress contributing to bowing. As one non-limiting example, for ON stacks, as the number of pairs of layers increases, the forces acting on the substrate may increase. Higher temperatures may contribute to these forces, further increasing the amount of bowing, and challenging the capability to properly chuck the substrate to the support assembly.

To compensate for these forces, an increased chucking voltage may be used to maintain a substantially planar substrate surface, although an amount of bowing may still occur. As these layer pairs continue to increase, the minimum voltage to maintain chucking may continue to increase. Consequently, in some embodiments a minimum chucking voltage may be above or about −250 V, and depending on the stress and number of pairs to compensate, the minimum chucking voltage may be greater than or about −300 V, greater than or about −350 V, greater than or about −400 V, greater than or about −450 V, greater than or about −500 V, greater than or about −550 V, greater than or about −600 V, greater than or about −650 V, greater than or about −700 V, greater than or about −750 V, greater than or about −800 V, greater than or about −850 V, greater than or about −900 V, greater than or about −950 V, greater than or about −1,000 V, or more.

As noted above, however, these deposition operations may be performed at increased temperatures, which may directly impact the resistivity of the chuck body material, and the ability of this material to operate appropriately as a J-R chuck. For example, electrostatic chuck body 405 may be aluminum nitride, for example, which may be characterized by a bulk resistance at a certain temperature. As the temperature of the material increases, resistance drops, and may drop significantly at temperatures above 500° C., for example. As the resistance drops, a likelihood of electrostatic discharge or arcing may increase. Additionally, to limit the substantial bowing of a substrate that may otherwise occur during these depositions, increased voltage may be used to maintain chucking. However, as this voltage is increased, the likelihood of arcing may similarly increase about the region of ledge 420, which may limit the amount of voltage that may be applied for chucking, and which may limit the ability to counteract bowing. This has conventionally led to damage and reduced quality of production.

However, the present technology utilizes materials and configurations that may facilitate an increased voltage window without leading to arcing compared to conventional technology. For example, conventional technology may exhibit arcing at clamping voltages above or about −300 V, or about −350 V. This voltage may be insufficient to compensate for the film stresses generated during deposition of multi-layer stacks, such as for ON deposition with tens or hundreds of layers of material. The present technology may facilitate chucking at voltages of between about −500 V to about −1000 V, and including between about −600 V to about −800 V, which may accommodate stresses associated with greater numbers of deposition layers, while limiting arcing from the pedestal.

For J-R chucking, chucking force generally increases to a saturation level as temperature increases due to the resistance changes within the pedestal material facilitating charge migration to the surface of the chuck body, such as protrusions 425 that may directly contact the substrate. However, this has conventionally led to arcing about the substrate when chucking voltage is increased to levels to accommodate increased substrate bowing. The present technology improves on these deficiencies providing assemblies that may operate at increased chucking voltages to compensate for increased substrate stresses by reducing leakage current in the substrate support assembly. Leakage current is an indicator of migration within a substrate support material, which may be measured from leakage occurring from the electrode to the heater.

Conventional technologies may accept leakage currents of greater than or about 10 mA at particular operating temperatures, which may increase dramatically at operating temperatures above 500° C. While conventional technologies may consider leakage current from a perspective of insulation layer damage or substrate damage, relatively high leakage currents may be accepted in an attempt to boost chucking force. However, this has led to increased arcing in conventional designs. The present technology modifies aspects and characteristics of the substrate support assembly to limit leakage current by effectively increasing resistivity of the substrate support materials to limit leakage current while maintaining chucking force at the substrate. Accordingly, the present technology produces substrate support assemblies characterized by a resistivity based on leakage current that is maintained within a range to adequately chuck a substrate characterized by stresses as previously described, while also limiting or preventing arcing due to higher chucking voltages.

The present technology may limit leakage current at temperatures greater than or about 500° C., and may limit leakage current at temperatures greater than or about 550° C., greater than or about 600° C., greater than or about 650° C., greater than or about 700° C., greater than or about 750° C., or higher. The present technology may also limit leakage current at chucking voltages of greater than or about 400 V, and may limit leakage current at chucking voltages of greater than or about 450 V, greater than or about 500 V, greater than or about 550 V, greater than or about 600 V, greater than or about 650 V, greater than or about 700 V, greater than or about 750 V, greater than or about 800 V, greater than or about 850 V, greater than or about 900 V, or higher. The present technology may limit leakage current within these temperature and voltage ranges to less than or about 10 mA, and may limit leakage current to less than or about 8 mA, less than or about 6 mA, less than or about 5 mA, less than or about 4 mA, less than or about 3.5 mA, less than or about 3 mA, less than or about 2.5 mA, less than or about 2 mA, less than or about 1.5 mA, or less. However, in some embodiments the leakage current may be maintained greater than or about 0.2 mA to ensure adequate migration to facilitate J-R chucking, and in some embodiments may maintain leakage currents greater than or about 0.3 mA, greater than or about 0.5 mA, greater than or about 0.7 mA, greater than or about 1.0 mA, or higher.

As noted above, J-R chucking may be at least partially based on a resistance of a contact layer provided between the substrate and the pedestal. By adjusting the distance of the electrode from the contact surface of the electrostatic chuck body, the resistance may be adjusted. Based on the increased temperatures of some embodiments of the present technology, the chucking force may be substantially maintained or minimally lowered as the regime may be along a relative plateau of chucking force. Consequently, in some embodiments, the electrode may be embedded further from a contact surface in some embodiments, which may effectively increase resistance of the substrate support assembly to reduce leakage currents that may contribute to arcing.

For example, as illustrated in FIG. 4, a contact surface may be formed along an outermost, such as an uppermost, surface of the substrate support assembly in the recessed pocket 408, which may be a top surface of the protrusions 425. From this plane, the electrode 410 may be embedded a certain depth within the substrate support assembly to maintain a minimum distance between the electrode and the substrate support surface. For example, in some embodiments the electrode 410 may be embedded within the electrostatic chuck body a distance or depth from the substrate support surface 406 of greater than or about 2 mm, and may be embedded a distance greater than or about 3 mm, greater than or about 4 mm, greater than or about 5 mm, greater than or about 6 mm, greater than or about 7 mm, greater than or about 8 mm, greater than or about 9 mm, greater than or about 10 mm, greater than or about 12 mm, greater than or about 14 mm, greater than or about 16 mm, greater than or about 18 mm, greater than or about 20 mm, or more from the substrate support surface, depending on characteristics of the substrate support assembly.

Electrostatic chuck body 405 may also be or include materials characterized by a particular volumetric resistivity. As noted above, the chuck body may be or include a ceramic material, such as aluminum nitride, or any of the materials discussed above. In some embodiments, the materials may be selected, doped, or produced, such as sintered, to provide a volumetric resistivity above a threshold. For example, in some embodiments, the chuck body may be or include a dielectric material, such as an aluminum nitride material, characterized by a volumetric resistivity greater than or about $5 \times 10^8$ ohm-cm at a temperature of greater than or about 550° C., greater than or about 600° C., greater than or about 650° C., or more, and which may be characterized by a volumetric resistivity greater than or about $1 \times 10^9$ ohm-cm, greater than or about $5 \times 10^9$ ohm-cm, greater than or about $1 \times 10^{10}$ ohm-cm, greater than or about $3 \times 10^{10}$ ohm-cm, greater than or about $5 \times 10^{10}$ ohm-cm, greater than or about $7 \times 10^{10}$ ohm-cm, greater than or about $1 \times 10^{11}$ ohm-cm, greater than or about $3 \times 10^{11}$ ohm-cm, greater than or about $5 \times 10^{11}$ ohm-cm, greater than or about $7 \times 10^{11}$ ohm-cm, greater than or about $1 \times 10^{12}$ ohm-cm, or greater at any of these temperature ranges.

An effective resistivity may also be accommodated by adjusting the amount of contact between a substrate and the substrate support assembly, for example. As illustrated in FIG. 4, a number of protrusions 425 may be included or defined along the substrate support surface 406. The protrusions may provide points of contact across a planar area of a substrate support surface or the recessed pocket. Consequently, the substrate may be in contact with the substrate support assembly along a percentage of the surface area of the substrate. Conventional technologies may provide a variety of high contact, such as above or about 60% contact, medium contact, such as around 40% contact, and low contact, which may be less than 20% contact. However, each of these ranges may provide increased leakage current compared to the present technology. Alternative low contact systems providing less than 1% contact may also be insufficient as these systems may not produce sufficient clamping forces to accommodate the bowing of substrates. The present technology may increase a surface area contact percentage for J-R chucking, while additionally adjusting characteristics of the clamping with the protrusion pattern.

A substrate 430 positioned on substrate support surface 406 may contact each of the protrusions 425, and may additionally extend at least partially across ledge 420 within recessed pocket 408. The present technology may increase the contact percentage along the wafer by increasing a number of protrusions. For example, the present technology may form protrusions characterized by a diameter or width of about 1 mm, about 2 mm, or more, and may in some embodiments include a combination of protrusions characterized by a diameter of greater than or about 1 mm and protrusions characterized by a diameter of greater than or about 2 mm. The protrusions may be characterized by any number of geometries and profiles in embodiments of the present technology. For an exemplary substrate support assembly, the substrate support surface within the recessed pocket may define greater than or about 250 protrusions, and may define greater than or about 500 protrusions, greater than or about 750 protrusions, greater than or about 1,000 protrusions, greater than or about 1,250 protrusions, greater than or about 1,500 protrusions, greater than or about 1,750 protrusions, greater than or about 2,000 protrusions, or more. The protrusions may be defined in any number of formations or patterns including uniform patterns as well as general distributions across the surface.

Additionally, an outermost subset 427 of protrusions 425 may be maintained a distance less than or about 5 mm from an inner radial edge of ledge 420, adjacent the protrusions. In some embodiments, an outermost subset of protrusions may be maintained a distance less than or about 4.5 mm from the inner radial edge of ledge 420, and may be maintained less than or about 4.0 mm, less than or about 3.5 mm, less than or about 3.0 mm, less than or about 2.5 mm, less than or about 2.0 mm, less than or about 1.5 mm, less than or about 1.0 mm, or less from the inner radial edge of ledge 420. By maintaining the protrusions within this distance, torque on an outermost area of a substrate may be maintained or increased, which may further facilitate clamping to compensate substrate bowing.

By producing protrusions according to some embodiments of the present technology, a percentage of contact along a surface of a substrate may be increased to greater than or about 1.0%, and may be greater than or about 1.5%, greater than or about 2.0%, greater than or about 2.5%, greater than or about 3.0%, greater than or about 3.5%, greater than or about 4.0%, greater than or about 4.5%, greater than or about 5.0%, or greater. The percentage of contact may be maintained below or about 10% to limit leakage current below the previously stated ranges, and may limit contact below or about 8%, below or about 6%, below or about 5%, or less. When not including an amount of contact along ledge 420, the percentage contact provided by the protrusions may be maintained greater than or about 0.2% of the surface area of the substrate surface along the substrate support assembly. In some embodiments the percentage contact provided by the protrusions excluding the ledge contribution may be maintained at greater than or about 0.3%, greater than or about 0.4%, greater than or about 0.6%, greater than or about 0.8%, greater than or about 1.0%, greater than or about 1.2%, greater than or about 1.4%, greater than or about 1.6%, greater than or about 1.8%, greater than or about 2.0%, greater than or about 2.2%, greater than or about 2.4%, greater than or about 2.6%, greater than or about 2.8%, greater than or about 3.0%, or greater. By providing substrate support assemblies characterized by controlled leakage currents, the present technology may provide an increased chucking window that may suitably chuck substrates characterized by increased film stresses, while limiting or preventing arcing within a plasma environment.

Figure 5:
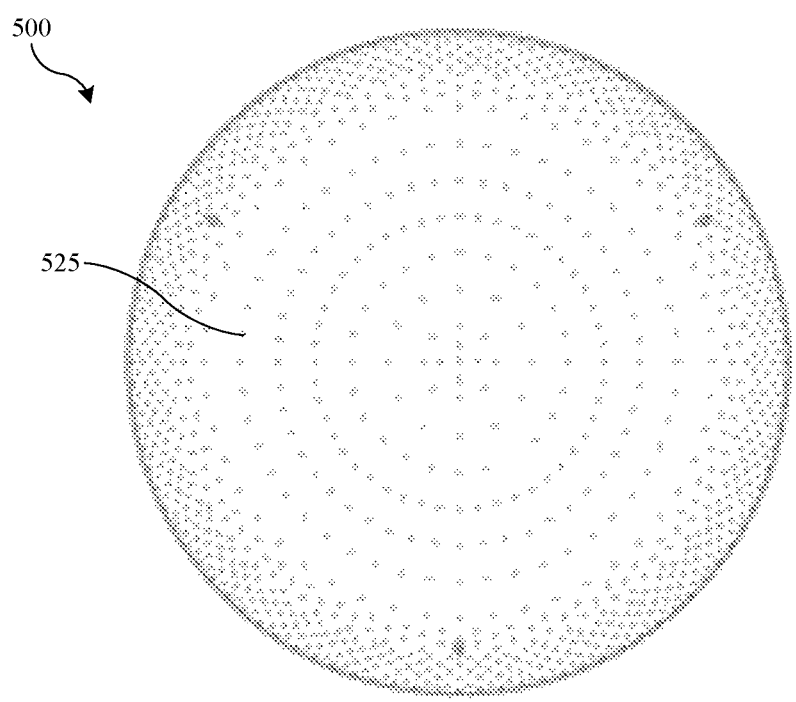
FIG. 5 shows a schematic partial top plan view of an exemplary substrate support assembly according to some embodiments of the present technology.

FIG. 5 shows a schematic partial cross-sectional view of an exemplary substrate support assembly 500 according to some embodiments of the present technology. Substrate support assembly 500 may include any of the materials or components previously described, and may illustrate additional details of substrate support assemblies previously discussed. For example, the previously discussed protrusions may be distributed across the surface of the substrate support in any pattern. Although a uniform distribution may be used, in some embodiments a non-uniform of protrusions may be used. FIG. 5 illustrates one exemplary distribution encompassed by the present technology, where the protrusions 525 may be distributed in a pattern of rings extending radially outward on the substrate support. Each ring may have more or less protrusions than a radially inward ring, and the distribution may increase in density at an outer region of the substrate support. For example, as illustrated, a radially outer portion of the substrate support may include an increased density of protrusions, which may improve chucking as previously described. Any number of other distribution patterns are similarly encompassed by the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
an electrostatic chuck body defining a substrate support surface;
a support stem coupled with the electrostatic chuck body;
a heater embedded within the electrostatic chuck body; and
an electrode embedded within the electrostatic chuck body between the heater and the substrate support surface, wherein the substrate support assembly is characterized by a leakage current through the electrostatic chuck body of less than or about 4 mA at a temperature of greater than or about 500° C. and a voltage of greater than or about 600 V.

2. The substrate support assembly of claim 1, wherein the electrostatic chuck body defines a recessed pocket along the substrate support surface encompassing a central region of the electrostatic chuck body.

3. The substrate support assembly of claim 2, wherein the substrate support surface defines a recessed ledge extending radially inward from an outer radial edge of the recessed pocket.

4. The substrate support assembly of claim 3, wherein the electrostatic chuck body defines a plurality of protrusions extending from the substrate support surface within the recessed pocket.

5. The substrate support assembly of claim 4, wherein a distance between a radially outermost protrusion and in inner radial edge of the recessed ledge is maintained below or about 3 mm.

6. The substrate support assembly of claim 4, wherein the electrostatic chuck body defines greater than or about 500 protrusions, and wherein each protrusion of the plurality of protrusions is characterized by a diameter of greater than or about 1 mm.

7. The substrate support assembly of claim 6, wherein a subset of protrusions of the plurality of protrusions are characterized by a diameter of greater than or about 2 mm.

8. The substrate support assembly of claim 4, wherein the plurality of protrusions define a contact area for a substrate seated on the substrate support surface of the electrostatic chuck body, and wherein the contact area is less than or about 10% of a planar area of the substrate.

9. The substrate support assembly of claim 1, wherein the electrostatic chuck body comprises a ceramic material.

10. The substrate support assembly of claim 9, wherein the ceramic material comprises aluminum nitride.

11. The substrate support assembly of claim 9, wherein the ceramic material is characterized by a volumetric resistivity of greater than or about $1 \times 10^9$ ohm-cm at a temperature of greater than or about 550° C.

12. A substrate support assembly comprising:
 an electrostatic chuck body defining a substrate support surface;
 a heater embedded within the electrostatic chuck body; and
 an electrode embedded within the electrostatic chuck body between the heater and the substrate support surface, wherein the electrode is maintained a distance of at least about 3 mm from the substrate support surface within the electrostatic chuck body, and wherein the substrate support assembly is characterized by a leakage current through the electrostatic chuck body of less than or about 4 mA at a temperature of greater than or about 540° C. and a voltage of greater than or about 660 V.

13. The substrate support assembly of claim 12, wherein the electrode is positioned within the electrostatic chuck body at a depth of at least about 5 mm from the substrate support surface of the electrostatic chuck body.

14. The substrate support assembly of claim 12, wherein the electrostatic chuck body comprises a ceramic material characterized by a volumetric resistivity of greater than or about $1 \times 10^9$ ohm-cm at a temperature of greater than or about 600° C.

15. The substrate support assembly of claim 12, wherein the electrostatic chuck body defines a recessed pocket within the substrate support surface configured to receive a substrate for processing.

16. The substrate support assembly of claim 15, wherein the substrate support surface defines a recessed ledge extending radially inward from an outer radial edge of the recessed pocket.

17. The substrate support assembly of claim 16, wherein the electrostatic chuck body defines a plurality of protrusions extending from the substrate support surface within the recessed pocket.

18. The substrate support assembly of claim 17, wherein the plurality of protrusions define a contact area for a substrate seated on the substrate support surface of the electrostatic chuck body, and wherein the contact area is less than or about 5% of a planar area of the substrate.

19. The substrate support assembly of claim 12, wherein the substrate support assembly is characterized by a leakage current through the electrostatic chuck body of less than or about 4 mA at a temperature of greater than or about 600° C. and a voltage of greater than or about 800 V.

20. A substrate support assembly comprising:
 an electrostatic chuck body defining a substrate support surface;
 a support stem coupled with the electrostatic chuck body;
 a heater embedded within the electrostatic chuck body; and
 an electrode embedded within the electrostatic chuck body between the heater and the substrate support surface, wherein the electrode is maintained a distance of at least about 5 mm from the substrate support surface within the electrostatic chuck body, and wherein the substrate support assembly is characterized by a leakage current through the electrostatic chuck body of less than or about 4 mA at a temperature of greater than or about 550° C. and a voltage of greater than or about 650 V.

* * * * *